United States Patent [19]

Kubo

[11] Patent Number: 5,243,300

[45] Date of Patent: Sep. 7, 1993

[54] HIGH FREQUENCY AMPLIFYING APPARATUS

[75] Inventor: Kazuhiko Kubo, Osaka, Japan

[73] Assignee: Matsushita Electric Industrial Co., Ltd., Osaka, Japan

[21] Appl. No.: 861,048

[22] Filed: Apr. 1, 1992

[30] Foreign Application Priority Data

Apr. 4, 1991 [JP] Japan .................................. 3-071524

[51] Int. Cl.$^5$ .............................................. H03G 3/30
[52] U.S. Cl. .................................... 330/284; 330/145
[58] Field of Search ................................ 330/145, 284; 455/249.1

[56] References Cited

U.S. PATENT DOCUMENTS 3,634,775 1/1972 Ulmer et al. ........................ 330/284

Primary Examiner—James B. Mullins
Attorney, Agent, or Firm—Pollock, VandeSande & Priddy

[57] ABSTRACT

A high frequency amplifying apparatus comprises: an amplifier for broadband-amplifying an input signal; a choke coil having one end supplied with a supply voltage and the other end connected to an output of the amplifier; and an automatic gain control circuit for outputting an amplified input signal with a gain controlled in accordance with an automatic gain control voltage, having: a first diode having an anode connected to the output of the amplifier and a cathode; an impedance element, one end of the impedance element being connected to the cathode of the first diode, the other end of the impedance element being connected to the ground; and a second diode having a cathode connected to the cathode of the first diode and an anode supplied with the automatic gain control voltage. The impedance element comprises a resistor and a second choke coil connected in series with the resistor. However, the second choke coil can be omitted.

4 Claims, 2 Drawing Sheets

HIGH FREQUENCY AMPLIFYING APPARATUS

BACKGROUND OF THE INVENTION

1. Field of the Invention

This invention relates to a high frequency amplifying apparatus for a television tuner or a CATV converter.

2. Description of the Prior Art

A high frequency amplifying apparatus is known which comprises a broad-band amplifier and an AGC (automatic gain control) circuit and is used in a television tuner, a CATV converter, a BS tuner, or the like.

Hereinbelow will be described such a prior art high frequency amplifying apparatus. FIG. 2 is a block diagram of a portion of a television tuner including a prior art high frequency amplifying apparatus 50b. In FIG. 2, numeral 1 is an input filter, numeral 2 is an AGC circuit, numeral 3 is an RF amplifying circuit (hereinafter referred to as an RF amplifier), numeral 4b is another AGC circuit, and numeral 5 is a mixer.

FIG. 3 is a schematic circuit diagram of the prior art high frequency amplifying apparatus 50b. In FIG. 3, numeral 6 is an RF (radio frequency) amplifier for RF amplifying which may comprise a discrete transistor circuit or an integrated circuit. Numerals 107 and 108 are AGC drive transistors, numerals 9, 10, and 11 are coupling capacitors, numeral 112 is a bypass capacitor, numerals 113 to 120 are resistors, numeral 21, 23, and 122 are choke coils, and numeral 124 and 125 are pin diodes.

Hereinbelow will be described operation of the prior art high frequency amplifying apparatus having the structure mentioned above. In FIG. 2, a high frequency signal inputted from a terminal A is filtered by the input filter 1. An output of the input filter 1 is applied to the AGC circuit 2. An output signal of the AGC circuit 2 whose gain is controlled is amplified by the RF amplifier 3. An output of the RF amplifier 3 is sent to another AGC circuit 4. The reason why the high frequency signal is passed through two AGC circuits 2 and 4 is to obtain a sufficient gain control range and to prevent a decrease in a noise figure. The gain-controlled signal is applied to a mixer 5 for converting the high frequency signal into an intermediate frequency signal. The converted intermediate frequency signal is outputted at a terminal B.

On the other hand, in FIG. 3, the high frequency signal inputted from a terminal C is passed through a coupling capacitor 9 and an RF amplifier 6. A load of the RF amplifier 3 is a choke coil because the RF amplifier 3 is a broad-bandpass type one. The output of amplifier 3 is applied to an AGC circuit 4b through the coupling capacitor 10. An AGC voltage is inputted from a terminal E to the transistor 107 provided for current amplification. The amplified AGC signal passes the choke coil 23 and the pin diode 124, and flows into the ground passing though a resistor 120 and a choke coil 122. The AGC voltage at the terminal E for the maximum gain of the AGC circuit 4 is about 7 to 8 V. A voltage of the AGC signal at an anode of the diode 124 is lower than this voltage by a voltage difference between two diodes. On the other hand, a voltage is supplied to an anode of the diode 125 from a transistor 108 in order to set a voltage of the anode of the diode 125. When the gain is set to the maximum, the diode 125 is turned off. Biasing of the transistor 108 is so determined that the diode 125 conducts gradually with decrease in the voltage at the terminal E for attenuation of the gain. The gain-controlled signal is outputted at a terminal D through the coupling capacitor 11. It is necessary to flow a current more than 10 mA through the pin diode to turn on it and the choke coil 23 is necessary to stop a high frequency signal and cannot be replaced with a resistor.

In the prior art having the structure mentioned above, there are problems that the circuit is complicated and there are a lot of parts. Particularly, there are a lot of choke coils in the circuit.

SUMMARY OF THE INVENTION

The present invention has been developed in order to remove the above-described drawbacks inherent to the conventional high frequency amplifying apparatus.

According to the present invention there is provided a high frequency amplifying apparatus comprising: an amplifier for broadband-amplifying an input signal; a choke coil having one end supplied with a supply voltage and the other end connected to an output of the amplifier; and an automatic gain control circuit for outputting an amplified input signal with a gain controlled in accordance with an automatic gain control voltage, having: a first diode having an anode connected to the output of the amplifier and a cathode; an impedance element, one end of the impedance element being connected to the cathode of the first diode, the other end of the impedance element being connected to the ground; and a second diode having a cathode connected to the cathode of the first diode and an anode supplied with the automatic gain control voltage. The impedance element comprises a resistor and a second choke coil connected in series with the resistor. However, the second choke coil can be omitted.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Figure 1:
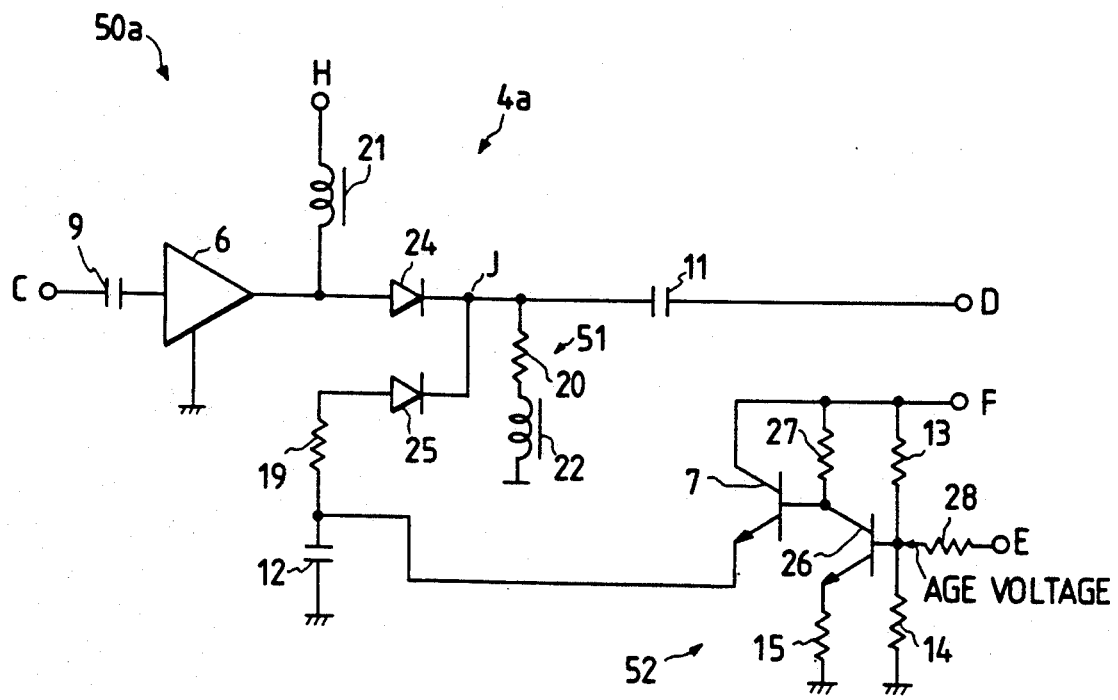
FIG. 1 is a schematic circuit diagram of the embodiment of this invention of a high frequency amplifying apparatus.
Figure 2:
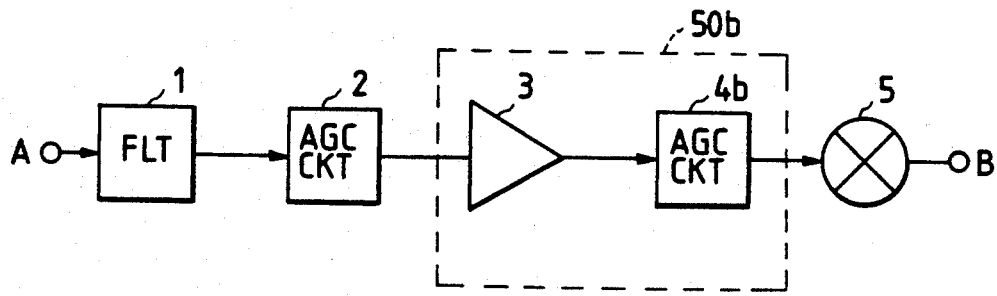
FIG. 2 is a block diagram of a portion of a television tuner including a prior art high frequency amplifying apparatus.
Figure 3:
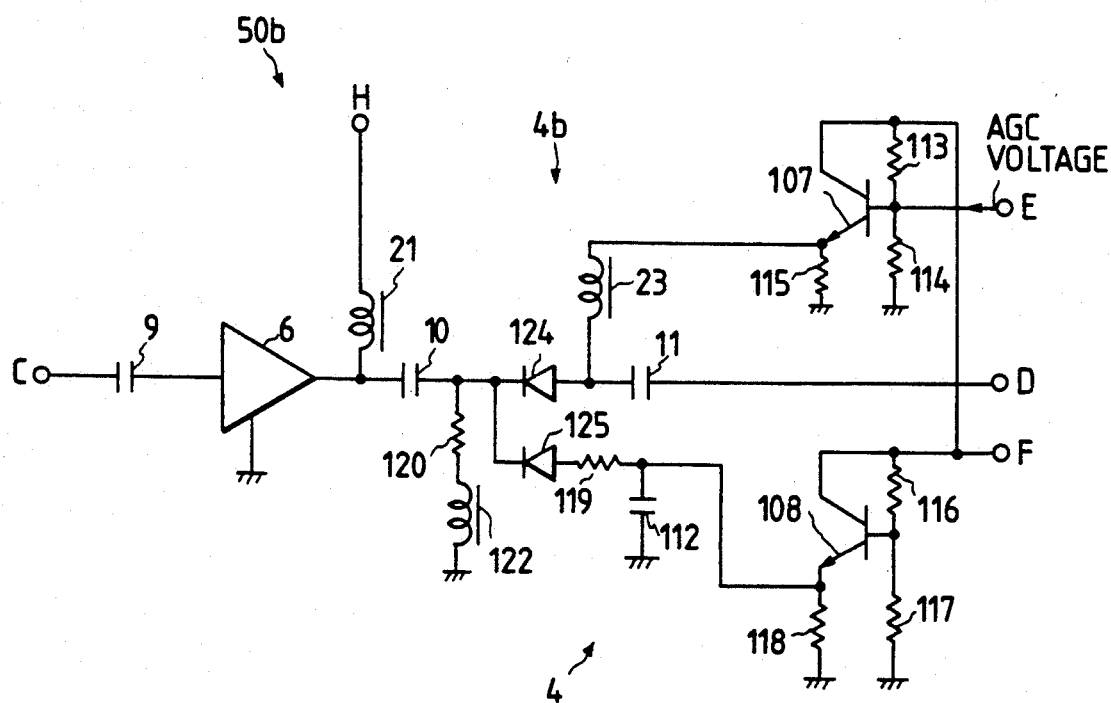
FIG. 3 is a schematic circuit diagram of the prior art high frequency amplifying apparatus shown in FIG. 2.

Hereinbelow will be described an embodiment of this invention of a high frequency amplifying apparatus with reference to a drawing. FIG. 1 is a schematic circuit diagram of the embodiment of this invention of a high frequency amplifying apparatus 50a. This high frequency amplifying apparatus 50a is used as similar to the prior art high frequency amplifying apparatus 50b as shown in FIG. 2.

In FIG. 1, an input signal incoming from a terminal C is applied to an broadband amplifier 6 through a coupling capacitor 9. The broadband amplifier 6 amplifies the input signal. The amplified signal is applied to a choke coil 21. One end of the choke coil 21 is supplied with a supply voltage from a terminal H and the other end is connected to an output of the amplifier 6. Therefore, an output voltage of the amplifier 6 appears across the choke coil 21. In other words, this amplifier 6 and the choke coil 21 do not form a tuning amplifying circuit but a broadband amplifying circuit having an essentially flat response over a wide frequency range. For example, if this high frequency amplifying apparatus is used in a television tuner, the broadband amplifying circuit amplifies the input signal over a frequency range of 50 MHz to 400 MHz. For satellite broadcasting, it has a frequency rage of 1 GHz, for example.

The amplified signal is sent to an automatic gain control circuit 4a for outputting an amplified input signal with a gain controlled in accordance with an automatic gain control (AGC) voltage. The automatic gain control circuit 4a comprises: a first pin diode 24 whose anode is connected to the output of the amplifier 6; an impedance element 51 whose one end is connected to the cathode of the first pin diode 24 at a junction point J and whose the other end is connected to the ground; and a second pin diode 25 whose cathode is connected to a cathode of the first pin diode 24 at the junction point J and whose anode is supplied with the automatic gain control voltage from a terminal E through a resistor 19 and a AGC amplifying circuit 52 including transistors 37 and 26.

The automatic gain control signal is applied to the AGC amplifying circuit 52 through a resistor 28 via the terminal E. The inputted automatic gain control voltage is applied to a base of the transistor 26. The base of the transistor 26 is biased by resistors 29 and 30 between a supply voltage from a terminal F and the ground. An emitter of the transistor 26 is connected to the ground through a resistor 15. Its collector is connected to a supply voltage from the terminal F through a resistor 27 and to a base of the transistor 7. A collector of the transistor 7 is connected to the supply voltage from the terminal F and whose emitter is connected to the anode of the second pin diode 25 through the resistor 19. The emitter of the transistor 7 is connected to the ground through a decoupling capacitor 12.

The impedance element 51 comprises a resistor 20 and a second choke coil 22 connected in series with the resistor 20. However, the choke coil 22 can be omitted.

Hereinbelow will be described operation of the embodiment.

A portion of the current flowing the choke coil 21 supplied with the supply voltage from the terminal H flows to the ground through the amplifier 6 and the remaining current flows to the ground through the impedance portion 51 via the first pin diode 24. Therefore, the output of the amplifier 6 is biased suitably. The input signal is amplified by the amplifier 6 and the output voltage appears across the choke coil 21. On the other hand, the automatic gain control voltage from the terminal E is inverted by the transistor 26 and amplified by the transistor 7. The amplified automatic control voltage is sent to the junction point J through the second pin diode 25 via the resistor 19. Therefore, a dc voltage at the junction point J is changed in accordance with the automatic control voltage. This controls the amount of the signal component passing the first pin diode 24. That is, when the automatic gain control signal is set to obtain the maximum gain of the high frequency amplifying apparatus 50a, the transistor 7 and the second pin diode 25 is turned off. With decrease in the gain, the transistor 7 and the second pin diode 25 begin to conduct, so that the voltage of the junction point J increases. This decreases the current of the first pin diode 24, so that an amount of the signal component is decreased. This operation provides an automatic gain control. This signal component is outputted at the terminal D through the coupling capacitor 11.

As mentioned above, according to the invention, the circuit of the high frequency amplifying apparatus is simplified and the number of choke coils is decreased. This is because the choke coil 21 as the load of the amplifier 6 is commonly used for supplying the current to the pin diode 24.

What is claimed is:

1. A high frequency amplifying apparatus comprising:
   (a) an amplifier for broadband-amplifying an input signal;
   (b) a choke coil having one end supplied with a supply voltage and the other end connected to an output of said amplifier; and
   (c) an automatic gain control circuit for outputting an amplified input signal with a gain controlled in accordance with an automatic gain control voltage signal, the circuit having:
      a first diode having an anode directly connected to said output of said amplifier;
      an impedance element, one end of said impedance element being connected to a cathode of said first diode, the other end of said impedance element being connected to the ground; and
      a second diode having a cathode connected to said cathode of said first diode, and an anode supplied with said automatic gain control voltage.

2. A high frequency amplifying apparatus as claimed in claim 1, wherein said impedance element comprises a resistor.

3. A high frequency amplifying apparatus as claimed in claim 1, wherein said impedance element comprises a resistor and a second choke coil connected in series with said resistor.

4. A high frequency amplifier comprising:
   a broadband stage for amplifying an input signal;
   a choke coil having one end connected to a supply voltage and the other end connected to an output of the amplifying stage;
   an AGC circuit having its input connected to an output of the amplifying stage for providing gain to an output of the amplifying stage—in response to an applied gain control voltage, the AGC circuit including—
      (a) a first diode having an anode directly connected to the output of the amplifying stage;
      (b) an impedance having a first terminal connected to a cathode of the first diode, a opposite terminal being grounded; and
      (c) a second diode having its cathode connected to the cathode of the first diode, an anode of the second diode being connected in circuit to the control voltage;
   and means for coupling a voltage, established across the impedance, to output terminals of the high frequency amplifier.

* * * * *